US012794420B2

(12) United States Patent
Tsai et al.

(10) Patent No.: US 12,794,420 B2
(45) Date of Patent: Nov. 10, 2026

(54) COUPLER DEVICE IN PHASED ARRAY SYSTEM

(71) Applicant: PHASETRUM INC., Taipei (TW)

(72) Inventors: Zuo-Min Tsai, Hsinchu City (TW); Yi-Ting Lin, Taichung City (TW); Chia-Hsuan Cheng, Hsinchu City (TW)

(73) Assignee: PHASETRUM INC., Taipei (TW)

( * ) Notice: Subject to any disclaimer, the term of this patent is extended or adjusted under 35 U.S.C. 154(b) by 383 days.

(21) Appl. No.: 18/487,145

(22) Filed: Oct. 16, 2023

(65) Prior Publication Data

US 2025/0125778 A1 Apr. 17, 2025

(51) Int. Cl.
*H03F 3/191* (2006.01)
*H03F 1/56* (2006.01)

(52) U.S. Cl.
CPC ............... *H03F 3/191* (2013.01); *H03F 1/56* (2013.01); *H03F 2200/222* (2013.01); *H03F 2200/387* (2013.01); *H03F 2200/451* (2013.01)

(58) Field of Classification Search
CPC ...... H03F 3/191; H03F 1/56; H03F 2200/222; H03F 2200/387; H03F 2200/451
USPC .......................................................... 330/305
See application file for complete search history.

(56) References Cited

U.S. PATENT DOCUMENTS 4,549,152 A 10/1985 Kumar
10,784,636 B1 9/2020 Vigilante et al.
2006/0121869 A1* 6/2006 Natarajan ................ H01Q 3/22 455/276.1
2006/0246855 A1 11/2006 Kato et al.
2008/0316101 A1* 12/2008 Brown .................. H03F 1/0277 342/374
2014/0191789 A1 7/2014 Saunders
2015/0091668 A1* 4/2015 Solomko .................. H01P 5/18 333/111

(Continued)

FOREIGN PATENT DOCUMENTS

CN 112332806 A 2/2021
WO WO-2012093392 A1 * 7/2012 ............... H01Q 1/38

OTHER PUBLICATIONS

Chia-Hsuan Cheng et al., "Researches on Full-Ka band Active 2D Phased Array Beamforming System and Ka-band Wideband High Output Power Amplifier", Master Thesis, Institute of Communications Engineering, National Yang Ming Chiao Tung University, Nov. 2022.

(Continued)

*Primary Examiner* — Hafizur Rahman
(74) *Attorney, Agent, or Firm* — IDEA Intellectual Limited; Sam T. Yip

(57) ABSTRACT

The present disclosure provides a coupler device for use in a phased array system. The coupler device includes a tunable amplifier and a coupler. The tunable amplifier is configured to convert an input signal to a first intermediate signal and a second intermediate signal. The coupler is coupled to the tunable amplifier. The coupler includes a first input port receiving the first intermediate signal, a second input port receiving the second intermediate signal, a first output port outputting a first output signal, and a second output port outputting a second output signal. A phase difference between a first phase of the first intermediate signal and a second phase of the second intermediate signal is a fixed phase angle.

20 Claims, 14 Drawing Sheets

(56) References Cited

U.S. PATENT DOCUMENTS

| | | | | |
|---|---|---|---|---|
| 2016/0142026 | A1* | 5/2016 | Kim | H03F 1/223<br>330/291 |
| 2021/0099145 | A1* | 4/2021 | Forest | H03F 3/245 |
| 2024/0372267 | A1* | 11/2024 | Zhang | H01Q 1/246 |
| 2024/0396504 | A1* | 11/2024 | Cui | H03F 1/26 |
| 2025/0350024 | A1* | 11/2025 | Wu | H01Q 3/30 |

OTHER PUBLICATIONS

Zong-Bin Huang et al., "A New Wideband mmWave Miniaturized Simultaneous Multi Beam Analog Beamforming System", Master Thesis, Department of Communications Engineering, National Yang Ming Chiao Tung University, Jun. 2021.

Partial European Search Report of the corresponding European patent application No. 24205953.3 mailed on Mar. 7, 2025.

Extended European Search Report of the corresponding European patent application No. 24205953.3 mailed on Jul. 2, 2025.

Lin Yi-Ting et al. "High-Accuracy, High-Gain Phased Array Utilizing Matrix-Sum and Tunable Amplifier Techniques", IEEE Access, vol. 11, Sep. 22, 2023 (Sep. 22, 2023), pp. 103377-103393.

2nd Office Action of the corresponding Taiwan patent application No. 112139311 mailed on May 19, 2025.

Office Action of corresponding Taiwan patent application No. 112139311 mailed on Jul. 22, 2024.

* cited by examiner

COUPLER DEVICE IN PHASED ARRAY SYSTEM

FIELD OF THE INVENTION

The present disclosure relates to wireless communication systems, and, in particular, to a coupler device in a phased array system.

BACKGROUND

Phased-array technology has become a critical system and sub-system in various applications, including 5G, beyond 5G communication, and radar, due to its ability to form beams, which improves power link budget and tracking accuracy. The precise control of the amplitude and phase of the RF signal of each antenna is essential for synthesizing the desired beam pattern. Thus, the ability to accurately adjust phase shifting and amplitude weighting is indispensable for a phased array system. The tuning range of the phase shifting and amplitude weighting determines the properties of the beam patterns, such as beam angle range, beam width, and beam type (e.g., sum or difference beam pattern). The accuracy of the phase and amplitude adjustments determines the deviation and resolution of the beam angle.

SUMMARY OF THE DISCLOSURE

In an aspect of the present disclosure, a coupler device for use in a phased array system is provided. The coupler device includes a tunable amplifier and a coupler. The tunable amplifier is configured to convert an input signal to a first intermediate signal and a second intermediate signal. The coupler is coupled to the tunable amplifier. The coupler includes a first input port receiving the first intermediate signal, a second input port receiving the second intermediate signal, a first output port outputting a first output signal, and a second output port outputting a second output signal. A phase difference between a first phase of the first intermediate signal and a second phase of the second intermediate signal is a fixed phase angle.

In another aspect of the present disclosure, a coupler device for use in a phased array system is provided. The coupler device includes: a power divider, configured to divide an input signal to generate a first signal and a second signal; a first balun (balance-to-unbalance), configured to convert the first signal to generate an inverted first signal; a second balun, configured to convert the second signal to generate an inverted second signal; a first variable gain amplifier, configured to amplify the inverted first signal to generate a third signal; a second variable gain amplifier, configured to amplify the inverted second signal to generate a fourth signal; and a coupler, coupled to the first variable gain amplifier and the second variable gain amplifier, wherein the coupler comprises a first input port receiving the third signal, a second input port receiving the fourth signal, a first output port outputting a fifth signal, and a second output port outputting a sixth signal.

BRIEF DESCRIPTION OF THE DRAWINGS

Aspects of the present disclosure are best understood from the following detailed description when read with the accompanying figures. It is noted that in accordance with the standard practice in the industry, various features are not drawn to scale. In fact, the dimensions of the various features may be arbitrarily increased or reduced for clarity of discussion.

Aspects of the present disclosure are best understood from the following detailed description when read with the accompanying figures. It is noted that in accordance with the standard practice in the industry, various features are not drawn to scale. In fact, the dimensions of the various features may be arbitrarily increased or reduced for clarity of discussion.

DETAILED DESCRIPTION

Figure 1:
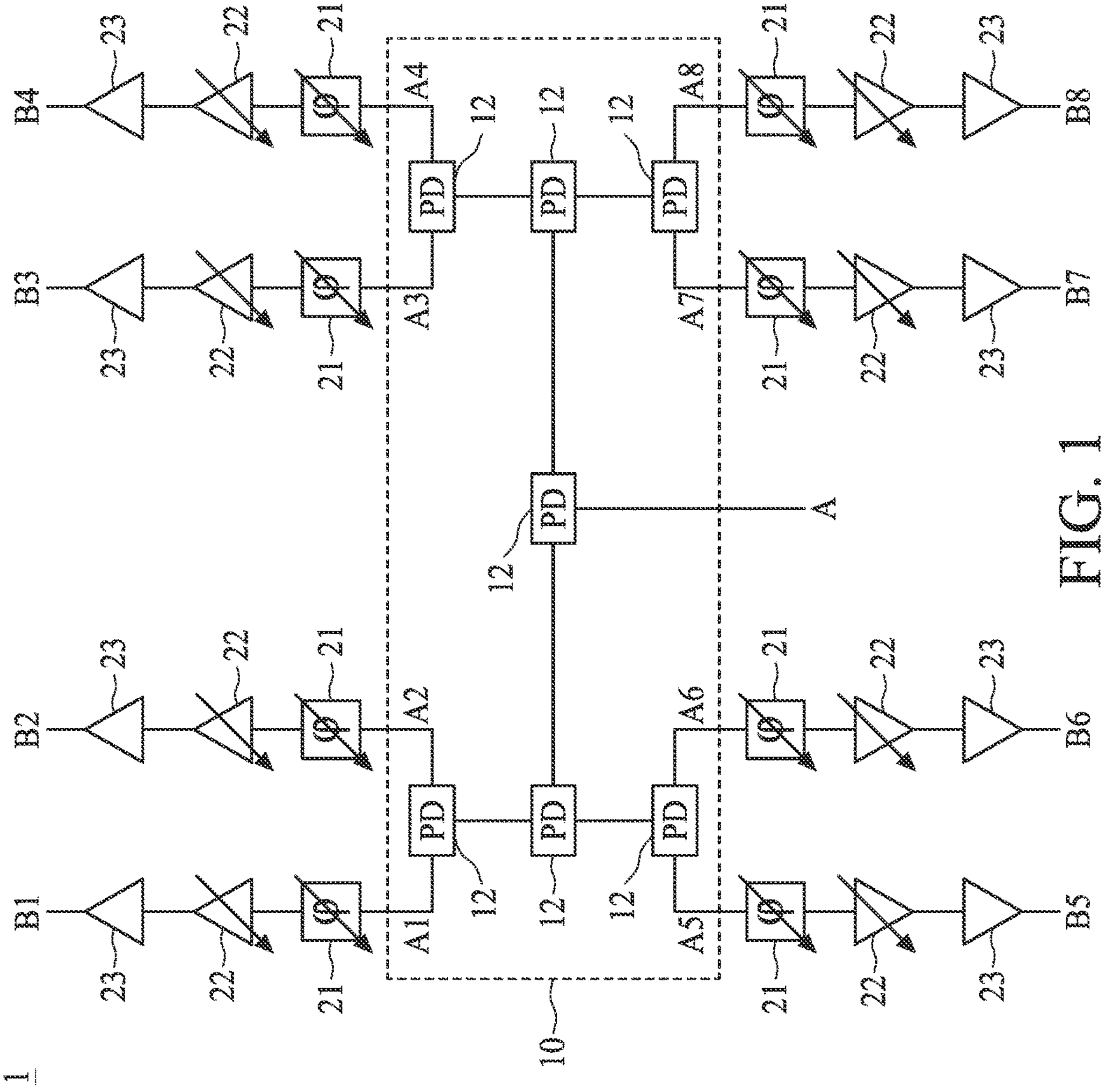
FIG. 1 is a block diagram of a phased array system 1 in accordance with an embodiment of the present disclosure.

The following disclosure provides many different embodiments, or examples, for implementing different features of the provided subject matter. Specific examples of operations, components, and arrangements are described below to simplify the present disclosure. These are, of course, merely examples and are not intended to be limiting. For example, a first operation performed before or after a second operation in the description may include embodiments in which the first and second operations are performed together, and may also include embodiments in which additional operations may be performed between the first and second operations. For example, the formation of a first feature over, on or in a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Time relative terms, such as "prior to," "before," "posterior to," "after" and the like, may be used herein for ease of description to describe one operations or feature's relationship to another operation(s) or feature(s) as illustrated in the figures. The time relative terms are intended to encompass different sequences of the operations depicted in the figures. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Relative terms for connections, such as "connect," "connected," "connection," "couple," "coupled," "in communication," and the like, may be used herein for ease of description to describe an operational connection, coupling, or linking one between two elements or features. The relative terms for connections are intended to encompass different connections, coupling, or linking of the devices or components. The devices or components may be directly or indirectly connected, coupled, or linked to one another through, for example, another set of components. The devices or components may be wired and/or wireless connected, coupled, or linked with each other.

As used herein, the singular terms "a," "an," and "the" may include plural referents unless the context clearly indicates otherwise. For example, reference to a device may include multiple devices unless the context clearly indicates otherwise. The terms "comprising" and "including" may indicate the existences of the described features, integers, steps, operations, elements, and/or components, but may not exclude the existences of combinations of one or more of the features, integers, steps, operations, elements, and/or components. The term "and/or" may include any or all combinations of one or more listed items.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

The nature and use of the embodiments are discussed in detail as follows. It should be appreciated, however, that the present disclosure provides many applicable inventive concepts that can be embodied in a wide variety of specific contexts. The specific embodiments discussed are merely illustrative of specific ways to embody and use the disclosure, without limiting the scope thereof.

FIG. 1 is a block diagram of a phased array system 1 in accordance with an embodiment of the present disclosure. The phased array system 1 may include a power distribution network 10, a plurality of phase shifters 21 (i.e., represented by the symbols q), a plurality of variable gain amplifiers 22, and a plurality of amplifiers 23. For purposes of description, there are 8 output paths of the power distribution network 10, each of which corresponds to a respective phase shifter 21, a respective variable gain amplifier 22, and a respective amplifier 23. The phased array system 1 may receive an input signal A distributed to each of the phase shifters 11 over the power distribution network 10. For example, the power distribution network 10 may include a plurality of power dividers 12, each of which may be configured to distribute the input power equally at two output ports. Thus, input signal A can be equally distributed to 8 output signals A1 to A8 by the power dividers 12 in the power distribution network 10, and the output signals A1 to A8 are fed to the respective phase shifters 21.

In some embodiments, the phase shifters 21 may be digitally controlled phase shifters, each of which may be configured to convert a phase of an input signal (e.g., A1 to A8) to generate an output signal with a respective preset phase according to a respective control parameter (not shown in FIG. 1). The phase shifters 21 may electronically vary the phase in a progressive repetitive manner between 0 and 360° to create a specific scan pattern. The output signal of each phase shifter 21 may be amplitude-weighted by a respective variable gain amplifier (VGA) 22, and the amplitude-weighted signals are amplified by the respective amplifiers 23 to generate desired output signals (e.g., B1 to B8). The output signals B1 to B8 may be radiated by respective antennae (not shown in FIG. 1), thereby synthesizing different beam cases.

However, due to the architecture of the phased array system 1, there may be three stages of power dividers 12 in the power distribution network 10, with each possibly causing a 3 dB power loss while dividing the input signal to two output signals. If more antennae are used by the phase array system 1, there will be more stages of the power dividers 12 in the power distribution network 10, resulting in more power loss of the output signals of the power distribution network. For example, if 8 antenna units are used, there may be 3 dB*3=9 dB power loss of each output signal A1 to A8 of the power distribution network. If a target output power is 20 dB, the amplifiers 23 at the output stage may require a high gain of over 29 dB to compensate the signal loss of the power distribution network 10.

Figure 2A:
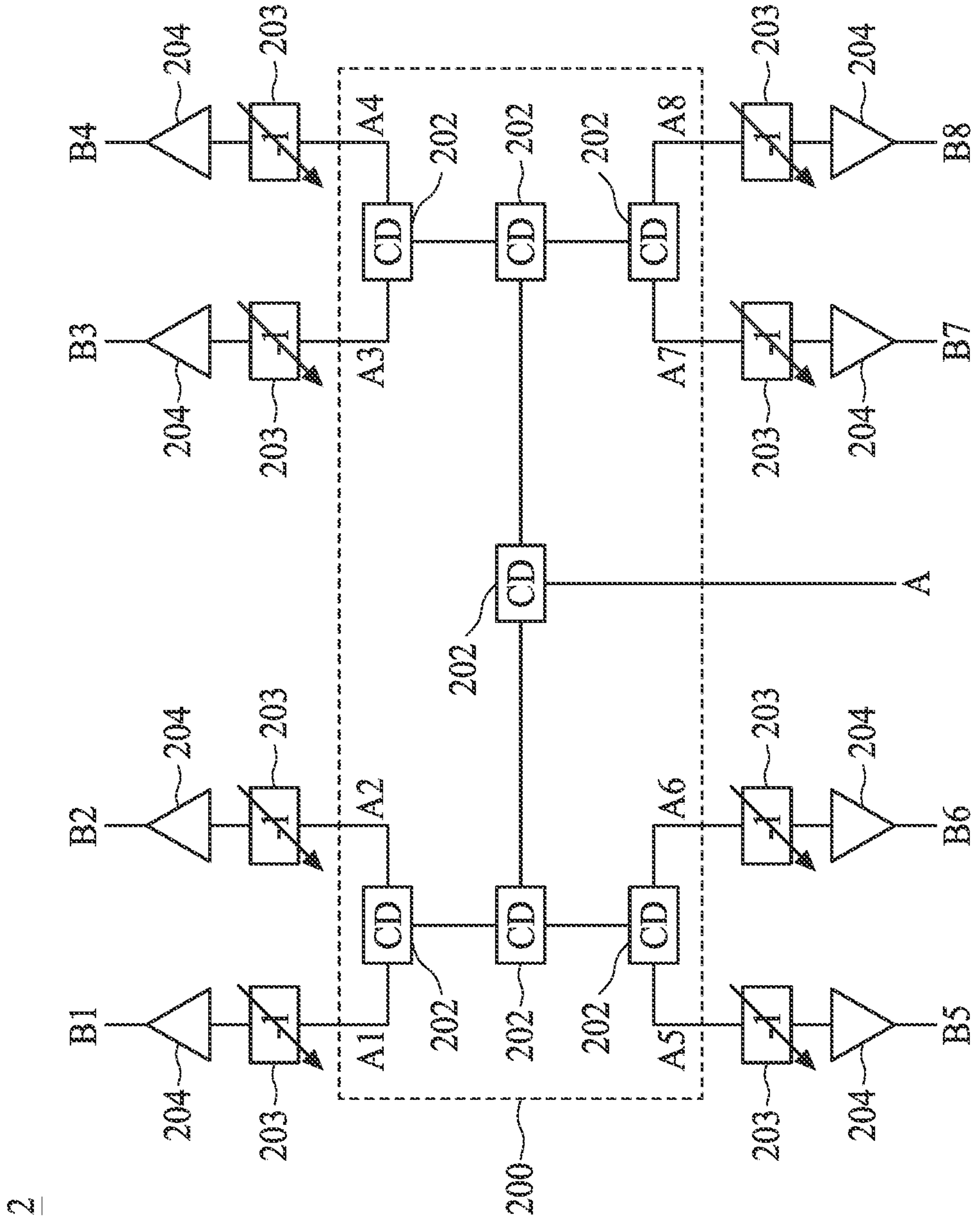
FIG. 2A is a block diagram of a phased array system 2 in accordance with an embodiment of the present disclosure.
Figure 2B:
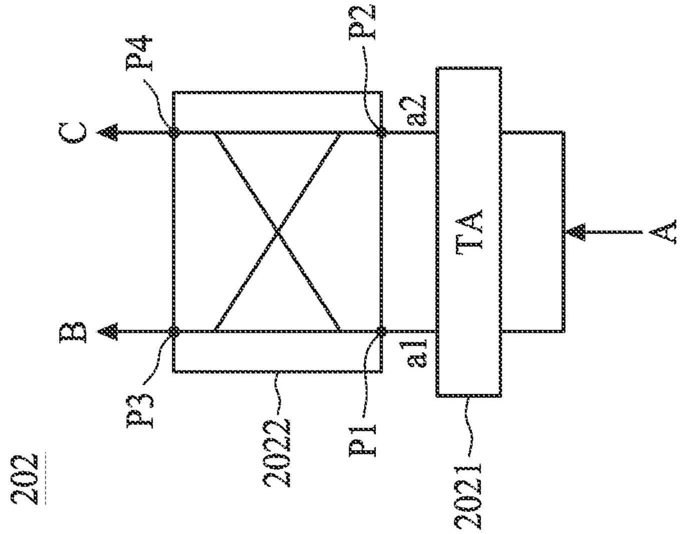
FIG. 2B is a block diagram of a coupler device of the embodiment of FIG. 2A.
Figure 2C:
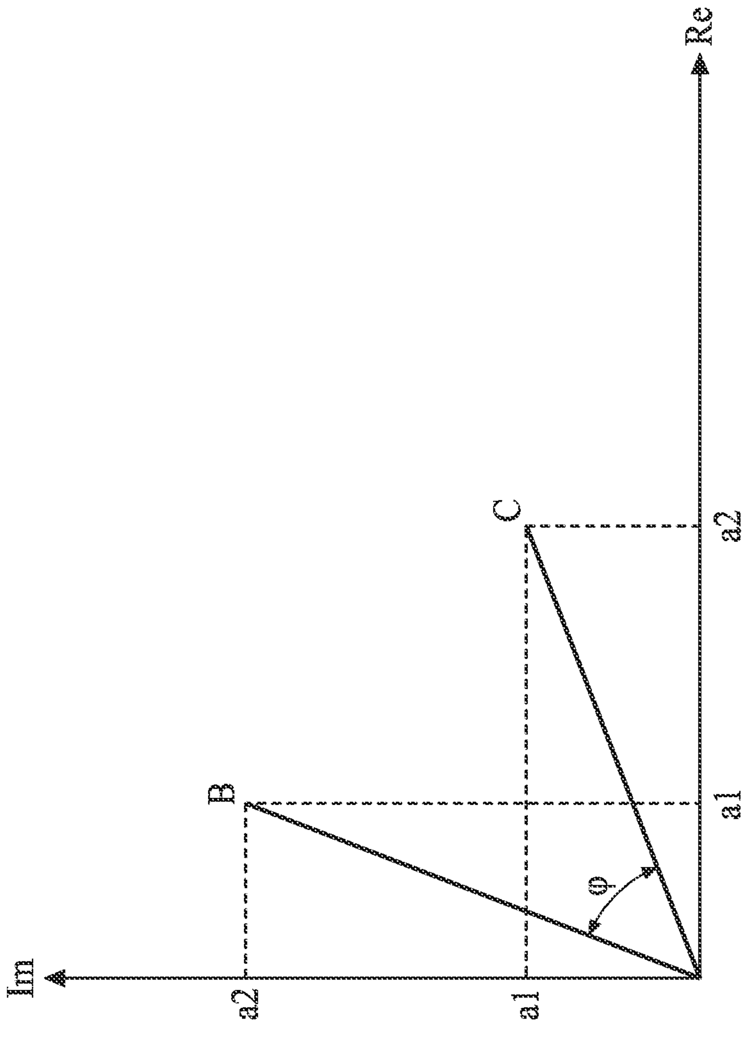
FIG. 2C is a diagram illustrating output signals B and C of FIG. 2B on a complex plane.

FIG. 2A is a block diagram of a phased array system 2 in accordance with an embodiment of the present disclosure. FIG. 2B is a block diagram of the coupler device 202 in accordance with the embodiment of FIG. 2A. FIG. 2C is a diagram illustrating the output signals B and C on a complex plane in accordance with the embodiment of FIG. 2B. Please refer to FIGS. 2A-2C.

In some embodiments, the phased array system 2 may include a weighting network 200. The weighting network 200 may include a plurality of coupler devices 202. For purposes of description, 8 output signals B1 to B8 are generated by the weighting network 200 of the phased array system 2, and the coupler devices 202 may be arranged in 3 stages of a cascaded architecture, but the present disclosure is not limited thereto. The output signals B1 to B8 may be radiated by respective antennae (not shown in FIG. 2A), thereby synthesizing different beam cases.

For example, the coupler devices 202 may be configured to amplify the input signal A, re-arrange the power ratio, and adjust the magnitude and/or phase of the output signal at each path to the respective amplifiers 204 to generate desired output signals to synthesize different beam cases. The output signal (e.g., A1 to A8) at each path of the weighting network 200 may be sent to the respective amplifiers 204 at the output stage, and the amplified output signal at each path may be radiated by the respective antenna (not shown in FIG. 2A). In some other embodiments, the output signal (e.g., A1 to A8) at each path of the weighting network 200 may be sent to respective phase inverters (not shown in FIG. 2A). The phase-inverted output signal at each path may be sent to the respective amplifier 204 at the output stage, and the amplified output signal at each path may be radiated by the respective antenna (not shown in FIG. 2A).

Referring to FIG. 2B, the coupler device 202 may include a tunable amplifier 2021 and a coupler 2022. The tunable amplifier 2021 may be configured to control the gains of intermediate signals a1 and a2 based on the input signal A, respectively. The coupler 2022 may be configured to generate the output signals B and C based on the intermediate signals a1 and a2. More specifically, each of the coupler devices 202 shown in FIG. 2A may be configured to control a phase difference of the two output signals B and C thereof to fixed phase angle q, which can be expressed by formula (1) as follows.

$$\text{phase}(B) - \text{phase}(C) = \varphi \quad (1)$$

In addition, the relationship between the phases of the input signal A and output signals B and C can be expressed by formula (2) as follows.

$$\begin{cases} \text{phase}(B) - \text{phase}(A) = \frac{\varphi}{2} \\ \text{phase}(C) - \text{phase}(A) = -\frac{\varphi}{2} \end{cases} \quad (2)$$

In some embodiments, the coupler 2022 may be a substantially 90° hybrid coupler, with two input ports P1 to P2 and two output ports P3 to P4. Two paths (i.e., two transmission lines) couple each input port to the two output ports P3 to P4. For example, a first transmission line may be coupled between the input port P1 and the output port P3, a second transmission line may be coupled between the input port P1 and the output port P4, and a third transmission line may be coupled between the input port P2 and the output port P3, and a fourth transmission line may be coupled between the input port P2 and the output P4.

The output signals B and C may be a linear combination of the intermediate signals a1 and a2. For example, a first portion of the output signal B may be from intermediate signal a1 which passes directly from the input port P1 to the output port P3 through a first transmission line, and a second portion of the output signal B may be from the intermediate signal a2 which passes from the input port P2 to the output port P3 through a second transmission line with a substantially 90° phase shift. Thus, the output signal B (i.e., vector B) can be expressed by formula (3) as follows.

$$B = a1\angle 0^\circ + j\cdot a2\angle 90^\circ = a1 + a2j \quad (3)$$

Similarly, a first portion of the output signal C may be from the intermediate signal a2 which passes directly from the input port P2 to the output port P4, and a second portion of the output signal C may be from the intermediate signal a1 which passes from the input port P1 to the output port P4 with a substantially 90° phase shift. Thus, the output signal C (i.e., vector C) can be expressed by formula (4) as follows.

$$C = a2\angle 0^\circ + j\cdot a1\angle 90^\circ = a2 + a1j \quad (4)$$

Accordingly, the output signals B and C can be illustrated on a complex plane as shown in FIG. 2C. It should be noted that there an inner angle φ separates the output signals B and C. The tunable amplifier 2021 can adjust a first gain and a second gain of the input signal A so as to control the magnitude of the signals a1 and a2, respectively, whereby inner angle φ shown in formula (1) can be controlled as well.

Figure 2D:
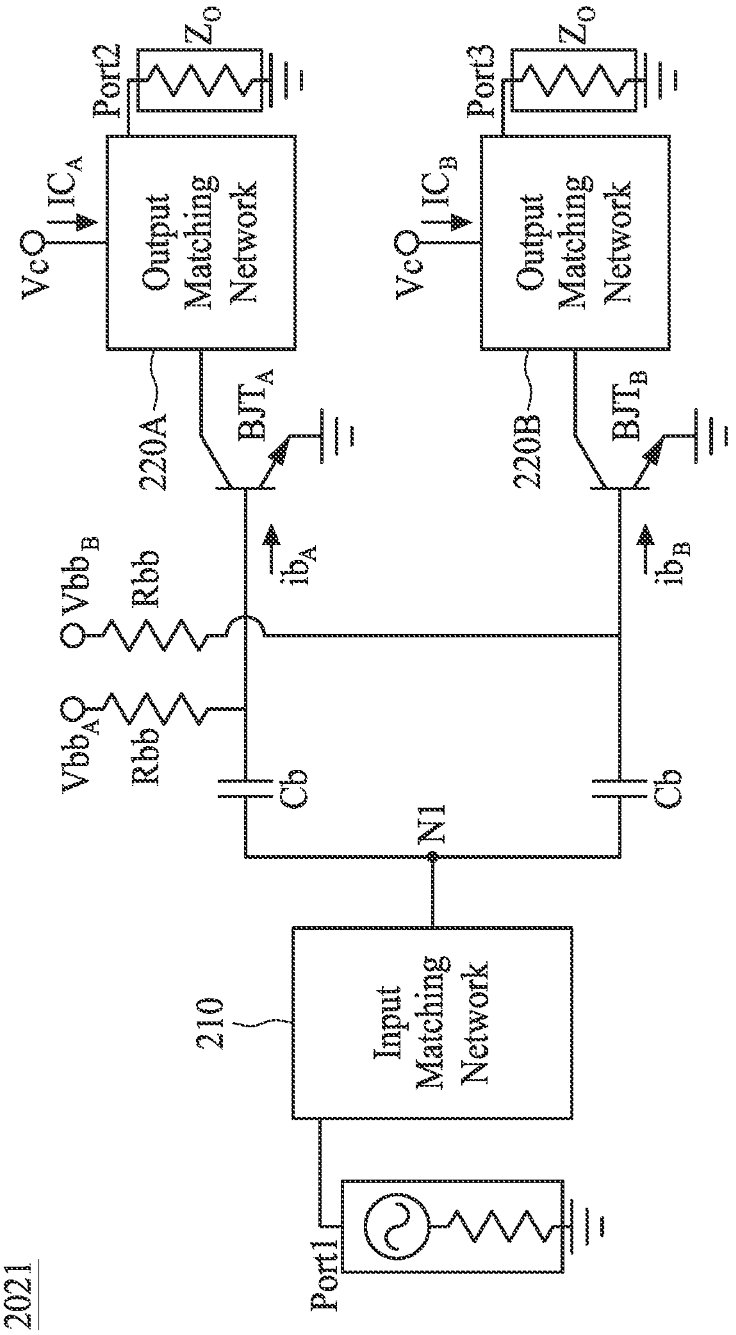
FIG. 2D is a schematic diagram of a tunable amplifier of FIG. 2B.
Figure 2E:
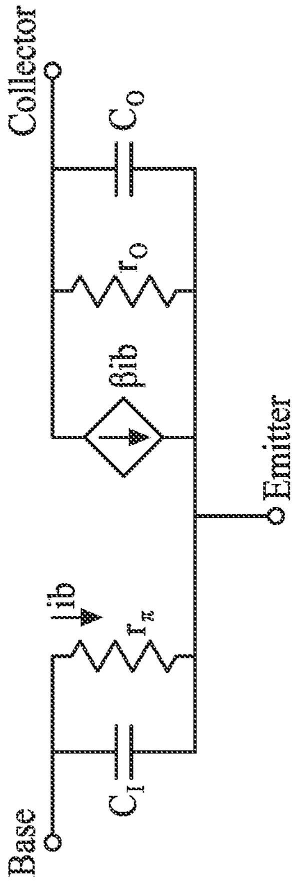
FIG. 2E is a diagram of a small-signal model of the BJT of FIG. 2D.
Figure 2F:
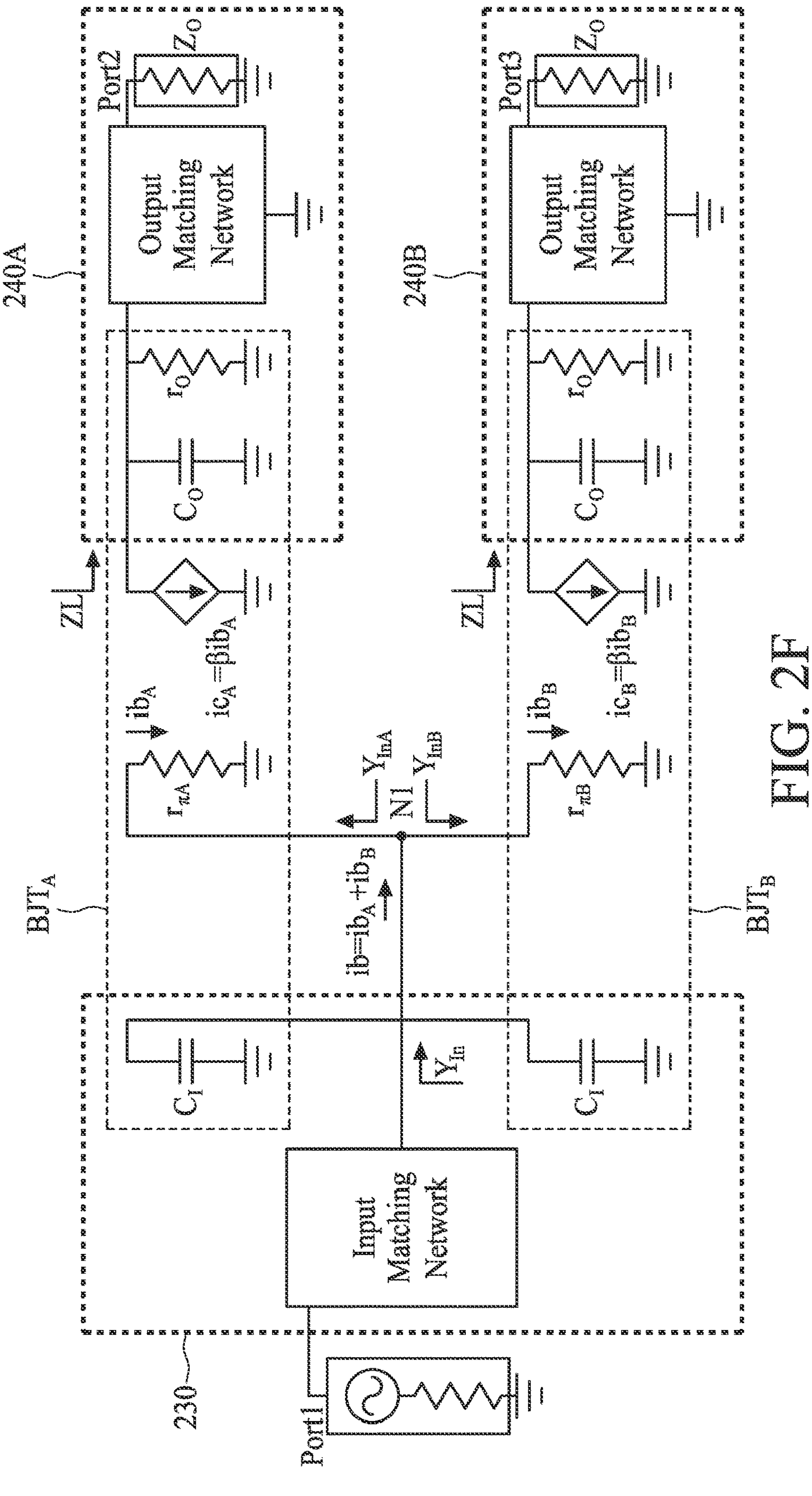
FIG. 2F is a diagram of a small-signal model of the tunable amplifier of FIG. 2D.
Figure 2G:
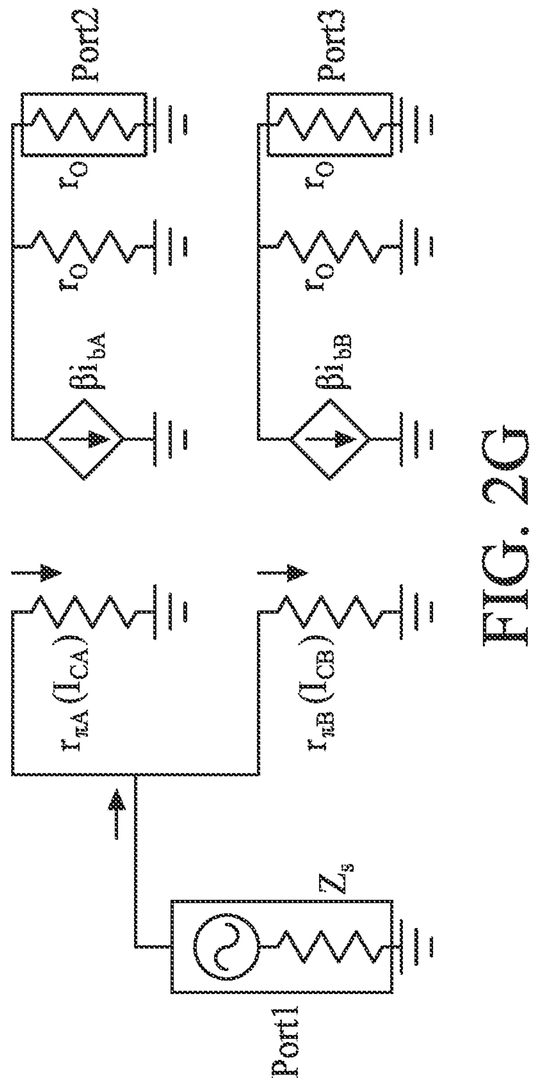
FIG. 2G is another diagram of a small-signal model of the tunable amplifier of FIG. 2D.

FIG. 2D is a schematic diagram of the tunable amplifier 2021 in accordance with the embodiment of FIG. 2B. FIG. 2E is a diagram of the small-signal model of a BJT in accordance with the embodiment of FIG. 2D. FIG. 2F is a diagram of the small-signal model of the tunable amplifier 2021 in accordance with the embodiment of FIG. 2D. FIG. 2G is another diagram of the small-signal model of the tunable amplifier 2021 in accordance with the embodiment of FIG. 2D. Please refer to FIGS. 2B and 2D to 2G.

The schematic diagram of the tunable amplifier 2021 is shown in FIG. 2D. In some embodiments, the bipolar junction transistors $BJT_A$ and $BJT_B$ may be provided with control voltages $Vbb_A$ and $Vbb_B$, respectively. In addition, the bipolar junction transistors $BJT_A$ and $BJT_B$ may be biased using large capacitors Cb and resistors Rbb, and. The values of the capacitors Cb and resistors Rbb may be large enough that the components shown in FIG. 2D may function as a biasing network, and can be omitted from the RF small-signal analysis. The bases of the bipolar junction transistors $BJT_A$ and $BJT_B$ may be connected to node N1, and the base currents $Ib_A$ and $Ib_B$ of the bipolar junction transistors $BJT_A$ and $BJT_B$ may be independently controlled by the control voltages $Vbb_A$ and $Vbb_B$.

An input matching network 210 may be applied to match the impedance of the shunted bipolar junction transistors $BJT_A$ and $BJT_B$ to the system impedance. The output matching networks 220A and 220B may be substantially the same, and may be applied to the output ports of the bipolar junction transistors $BJT_A$ and $BJT_B$ to match the output impedance of the bipolar junction transistors $BJT_A$ and $BJT_B$ to the system impedance $Z_0$. In addition, the output matching networks 220A and 220B may be configured to provide bias currents $Ic_A$ and $Ic_B$ of the bipolar junction transistors $BJT_A$ and $BJT_B$.

A small-signal model of a bipolar junction transistor (e.g., $BJT_A$ or $BJT_B$ in FIG. 2D) is shown in FIG. 2E, where CI and CO may denote equivalent capacitances at the base and collector nodes, respectively. The gain of the BJT with conjugate matched source/load impedance ($G_{BJT,M}$) can be evaluated using formula (5) as follows.

$$G_{BJT,M} = -\frac{\beta}{2}\sqrt{\frac{r_o}{r_\pi}} \quad (5)$$

where $r_\pi$ denotes the input resistance of the BJT, $r_o$ denotes the output resistance of the BJT, and β denotes the current gain of the BJT. In addition, by applying the relationships between the parameters $r_\pi$, Ic and Ib (e.g., $$r_\pi = \frac{\beta V_T}{Ic}$$

and Ic=βIb), formula (5) can be rewritten as formula (6) as follows.

$$G_{BJT,M} = -\frac{1}{2}\sqrt{\frac{\beta r_o}{r_\pi}}\sqrt{Ic} \quad (5)$$

Referring to the small-signal model of the tunable amplifier 2021 shown in FIG. 2F, the input resonated capacitance can be merged into the input matching network 210 and output matching networks 220A to 220B as source networks and load networks since the input nodes of the bipolar junction transistors $BJT_A$ and $BJT_B$ are shunted. Thus, the small-signal model of the tunable amplifier 2021 can be simplified to two current-controlled current sources connected to one source network 230 and two load networks 240A to 240B, and the simplified small-signal model of the tunable amplifier 2021 as shown in FIG. 2G.

In some embodiments, the link budget of the phased array system 2 shown in FIG. 2A may be associated with the total power of the signals. The input signal A may be distributed and weighted by the coupler devices 202 in the weighting network 200 to obtain the signals A1 to A8. The signals A1 to A8 may be amplified by respective amplifiers 204 at the output stage. Since the coupler 2022 of the coupler device 202 may be a lossless and passive component, the link budget of the phased array system 2 may be associated with the stages of coupler devices.

Referring to FIG. 2G, the input resistance $r_{\pi A}$ of the bipolar junction transistor $BJT_A$ can be expressed by the function of the collector current $I_{CA}$ (e.g., $$r_{\pi A} = \frac{\beta V_T}{I_{CA}}$$

and $I_{CA}=\beta I_{bA}$), and the input resistance of the bipolar junction transistor $BJT_B$ can be expressed by the function of the collector current $Ic_B$ (e.g., $$r_{\pi B} = \frac{\beta V_T}{I_{CB}}$$

and $I_{CB}=\beta I_{bB}$). With such design of the tunable amplifier 2021, the gains of the output signals at the output ports Port2 and Port3 of the tunable amplifier 2021 can be independently controlled. Therefore, the tunable amplifier 2021 may be equivalent to an ideal power divider with amplifiers so as to achieve the functions of power conservation and signal amplification.

Figure 2H:
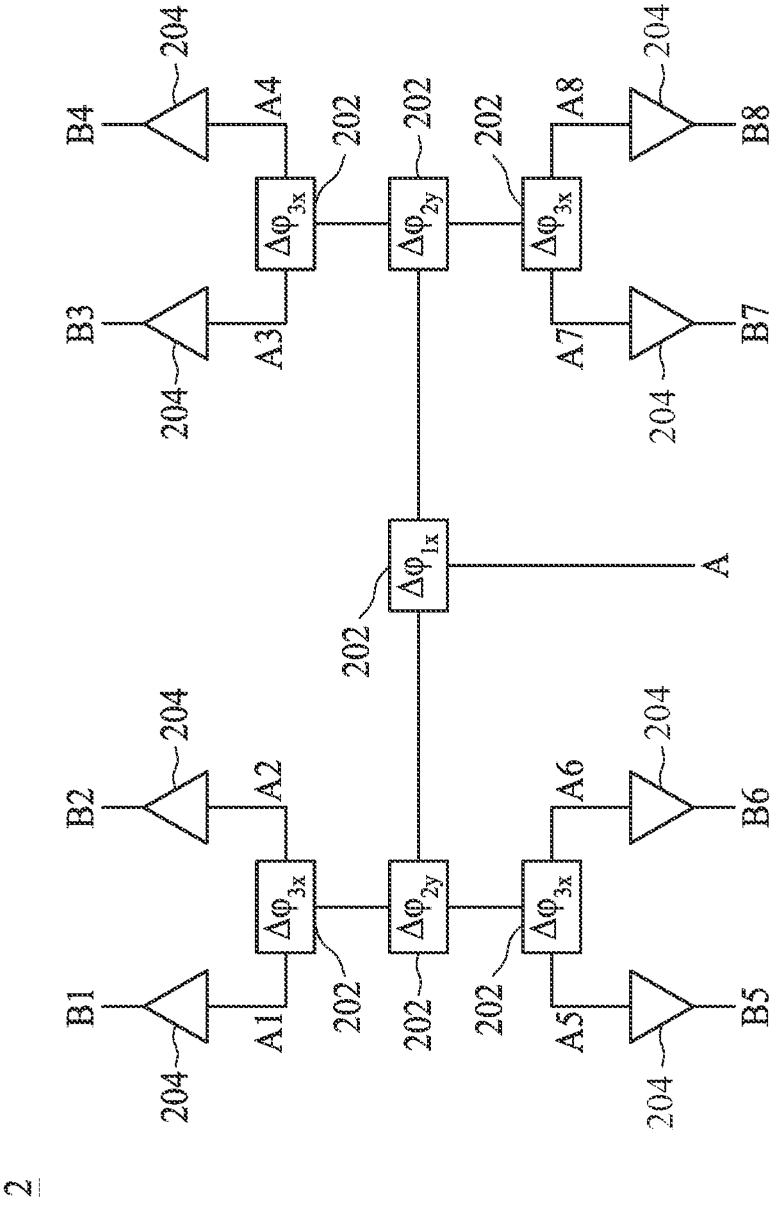
FIG. 2H is a diagram illustrating phase control of the phased array system 2 in accordance with the embodiment of FIG. 2A.

FIG. 2H illustrates phase control of the phased array system 2 in accordance with the embodiment of FIG. 2A. As described in the embodiment of FIG. 2C, the phase difference between the output signals B and C of the coupler device 202 can be controlled by adjusting the gains of the output signals B and C using the tunable amplifier 2021, the coupler device 202 may also have the function of phase shifting. Thus, the coupler devices 202 can be appropriately arranged, so the phase difference of the output signals for each coupler device 202 can be horizontal and vertical. For example, regarding the coupler device 202 receiving the input signal A, a first-stage phase difference $\Delta\varphi_{1x}$ may be horizontal (i.e., X-axis). For the coupler devices 202 in the second stage, a second-stage phase difference $\Delta\varphi_{2y}$ may be vertical (i.e., Y-axis). For the coupler devices 202 in the third stage, a third-stage phase difference $\Delta\varphi_{3x}$ may be horizontal (i.e., X-axis), as shown in FIG. 2H.

Figure 3:
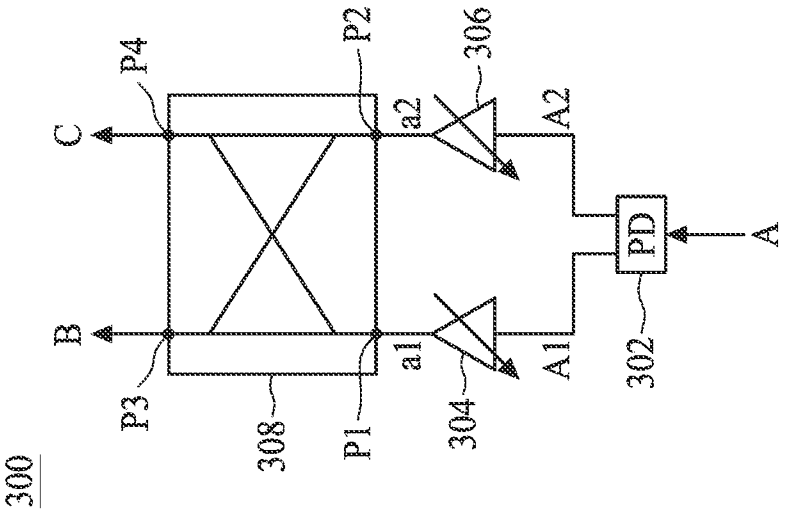
FIG. 3 is a block diagram of a coupler device 300 in accordance with another embodiment of the present disclosure.

FIG. 3 is a block diagram of a coupler device 300 in accordance with another embodiment of the present disclosure.

In some embodiments, the coupler device 202 shown in FIG. 2A may be implemented by the coupler device 300 shown in FIG. 3. The coupler device 300 may include a power divider 302, variable gain amplifiers 304 and 306, and a coupler 308.

The power divider 302 may be a 1-to-2 passive power divider configured to divide an input signal A into two signals A1 and A2. The signals A1 and A2 may be amplified by the variable gain amplifiers 304 and 306 to obtain intermediate signals a1 and a2, respectively. The gains of the variable gain amplifiers 304 and 306 may be controlled independently. The coupler 308 may be similar to the coupler 2022 shown in FIG. 2B, the details of which are not repeated here.

In the interest of power conservation, the power divider 302 may cause a 3 dB signal loss of the input signal A. As stages of the power dividers 302 increase, signal losses in the phased array system increase correspondingly. For example, three stages of coupler devices 202 are shown in FIG. 2A. Use of coupler devices 300 as coupler devices 202 crates a 9 dB signal loss. If a design of 64 antenna units is used, there will be 6 stages of coupler devices 300 which will cause a 3 dB*6=18 dB signal loss. Furthermore, the generated signal loss may be compensated by the amplifiers 204 at the output stage. If the output power requirement is 20 dB, the amplifiers 204 at the output stage require a very high gain of 38 dB, which may risk signal oscillation.

Figure 4:
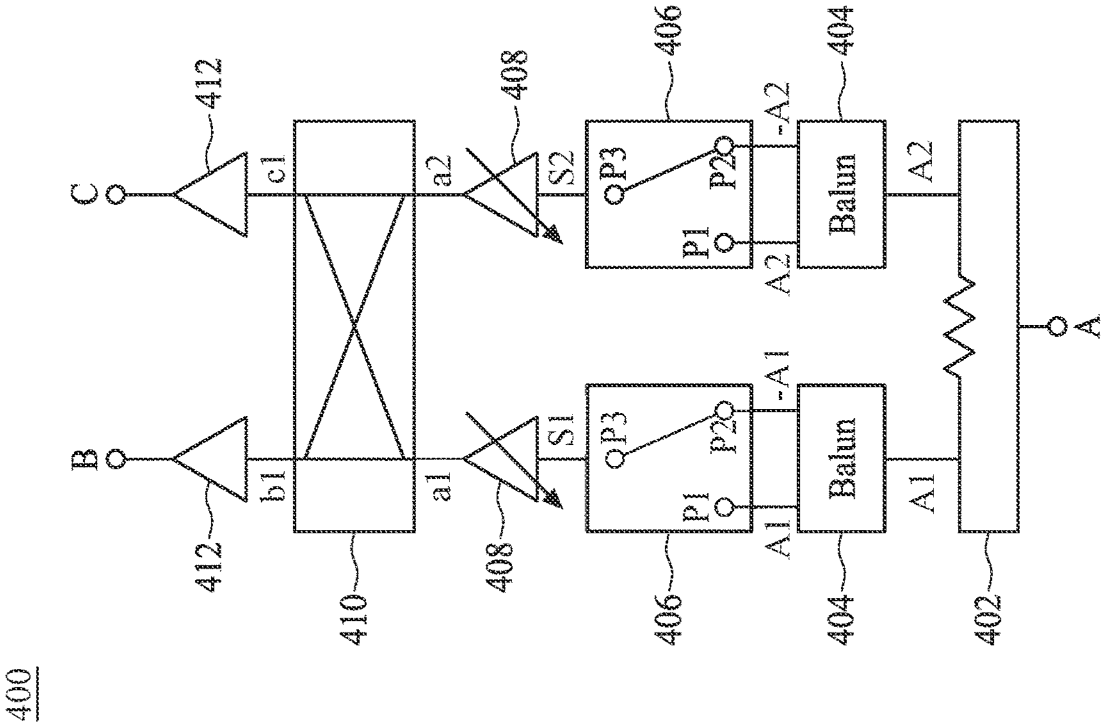
FIG. 4 is a block diagram of a coupler device in accordance with another embodiment of the present disclosure.

FIG. 4 is a block diagram of a coupler device in accordance with yet another embodiment of the present disclosure. Please refer to FIG. 2A and FIG. 4.

In another embodiment, the coupler device 202 shown in FIG. 2A can be implemented using the coupler device 400 shown in FIG. 4. The coupler device 400 may be a 1-to-2 coupler device, which includes a power divider 402, baluns (balance-to-unbalance) 404, switches 406, variable gain amplifier 408, a coupler 410, and amplifiers 412, as shown in FIG. 4.

Figure 5A:
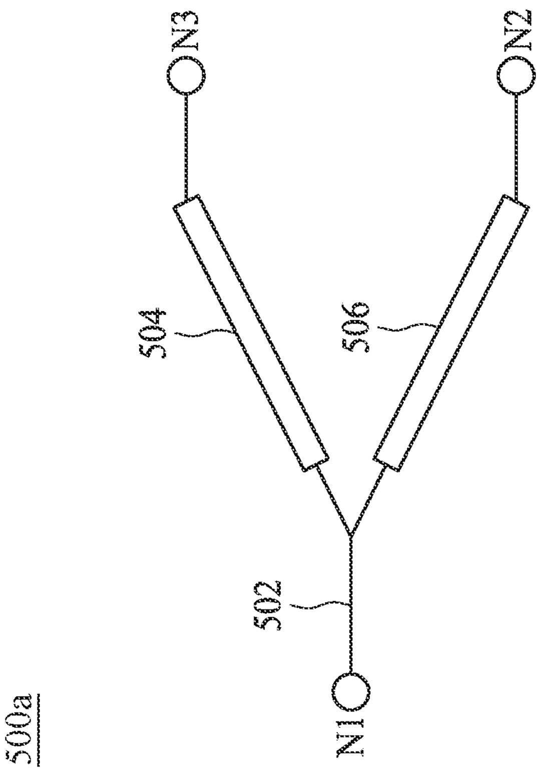
FIG. 5A is a diagram illustrating a power divider in accordance with an embodiment of the present disclosure.

In some embodiments, the power divider 402 may be a three-port microwave device that is used for power division or power combining. The power divider 402 may be a 1-to-2 passive power divider configured to divide an input signal A into two signals a1 and a2. In some embodiments, the power divider 402 may be implemented by a T-junction power divider 500*a* shown in FIG. 5A, which is a three-port network that can be implemented in any kind of transmission medium such as a microstrip line, stripline, coplanar waveguide, etc. In some embodiments, microstrip line 502 may have a characteristic impedance value approximately equal to 50 ohms, and the microstrip lines 504 and 506 may have characteristic impedance values approximately equal to 100 ohms, but the present disclosure is not limited thereto.

Figure 5B:
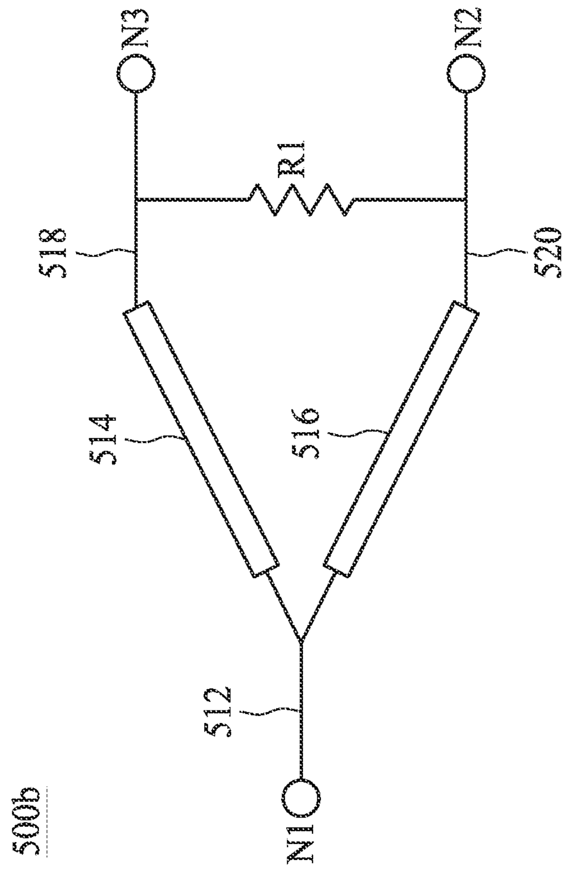
FIG. 5B is a diagram illustrating a power divider in accordance with another embodiment of the present disclosure.

In some embodiments, the power divider 402 may be implemented by a Wilkinson power divider 500*b* shown in FIG. 5B. The Wilkinson power divider 500*b* may be a robust power divider with the output ports matched, and with the reflected power dissipated, and it may provide better isolation between the output ports N2 and N3 in comparison with the T-junction power divider 500*a* shown in FIG. 5A. The Wilkinson power divider 500*b* can also be used to provide arbitrary power division. In some embodiments, the microstrip line 512 may have a characteristic impedance value approximately equal to 50 ohms, and the microstrip line 514 and 516 may have characteristic impedance values substantially equal to 70.7 ohms. The microstrip lines 518 and 520 may have characteristic impedance values substantially equal to 50 ohms, and the resistor R1 may have a resistance value substantially equal to 100 ohms, but the present disclosure is not limited thereto.

In some embodiments, each of the baluns 404 can be referred to as a balance-to-unbalance device that is configured to provide its input signal and phase-inverted input signal at its two output terminals. For example, the balun 404 on the left of FIG. 4 may receive the signal a1 as the input signal, and it may provide the signal a1 and the inverted signal-a1 at its two output terminals. Similarly, the balun 404 on the right of FIG. 4 may receive the signal a2 as its input signal, and it may provide the signal a2 and the inverted signal-a2 at its two output terminals. In some embodiments, the baluns 404 may be implemented using Marchand baluns 600 shown in FIG. 6, which is a wideband 3-port network including two sets of coupled lines. Each set of coupled lines may have a length substantially equal to N4, wherein 2 denotes the wavelength of the radio frequency signal used by the phased array system 2 shown in FIG. 2A.

Figure 6:
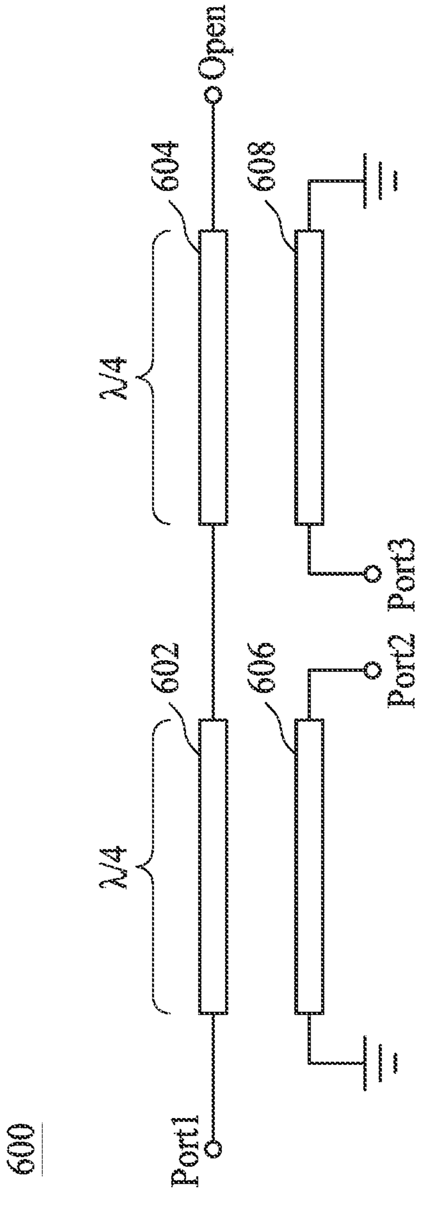
FIG. 6 is a diagram illustrating a Marchand balun in accordance with an embodiment of the present disclosure.

Referring to FIG. 6, Port1 refers to an unbalanced port, and Port2 and Port3 refer to balanced ports. In the configuration of the coupler device 400 in FIG. 4, the input signal A1 is fed to the unbalanced port Port1 of the balun 404 on the left, and signals A1 and −A1 may be generated at the balanced port Port2 and Port3. In addition, the input signal A2 is fed to the unbalanced port Port1 of the balun 404 on the right, and signals A2 and −A2 may be generated at the balanced port Port2 and Port3. In other words, the balanced port Port2 may provide an output signal that has a zero phase difference with the input signal, and the balanced port Port3 may provide an output signal has 180-degree phase difference (i.e., phase inverted input signal) with the input signal.

Attention now is directed back to FIG. 4. In some embodiments, the switches 406 may be implemented using series single-pole-double-throw (SPDT) switches or series-shunt SPDT switches, but the present disclosure is not limited thereto. In the configuration of the coupler device 400 in FIG. 4, the signal S1 may be the inverted signal A1 (i.e., −A1), and the signal S2 may be the inverted signal A2 (i.e., −A2). It should be noted that the signal selection of the switches 406 may be based on the design of the coupler device, and the signals S1 and S2 can be the signals A1 and A2 in some other embodiments.

In some embodiments, each of the variable gain amplifiers 408 may be a three-stage amplifier which includes a common-gate (CG) amplifier, a common-source (CS) amplifier, and a common-drain (CD) amplifier connected in series. The common-gate amplifier may be used as an input stage, the common-source amplifier may be used as a gain stage, and the common-drain amplifier may be used as an output stage. In some embodiments, a variable resistor (not shown) can be disposed between the common-gate amplifier and the common-source amplifier so as to adjust the gain of the common-source amplifier. In the configuration of the coupler device 400 shown in FIG. 4, the variable gain amplifiers 408 may be configured to amplify the signals S1 and S2 to generate signals a1 and a2.

In some embodiments, the coupler 410 may be implemented using a branch-line coupler or a coupled-line coupler, but the present disclosure is not limited thereto. For example, the coupler 410 may receive the signals a1 and a2 to generate signals b1 and c1. In some embodiments, the coupler 410 may be similar to the coupler 2022 shown in FIG. 2B, the details of which can be referred to in the embodiment of FIG. 2B. In addition, the In some embodiments, each of the amplifiers 412 may also be a three-stage amplifier which includes a common-gate (CG) amplifier, a common-source (CS) amplifier, and a common-drain (CD) amplifier connected in series. The common-gate amplifier may be used as an input stage, the common-source amplifier may be used as a gain stage, and the common-drain amplifier may be used as an output stage. In comparison with the variable gain amplifier 408, the gain of the amplifier 412 may be fixed so as to compensate the signal loss caused by the passive components in the coupler device 400, such as the power divider 402, baluns 404, and switches 406. In the configuration of the coupler device 400 shown in FIG. 4, the amplifiers 412 may be configured to amplify the signals a1 and a2 to generate output signals B and C. In some embodiments, the amplifiers 412 can be omitted in the coupler device 400, and other amplifiers (e.g., amplifiers 204) can be disposed at the output stage of each path of the phased array system 2 shown in FIG. 2A.

While the present disclosure has been described with specific embodiments thereof, it is evident that many alternatives, modifications, and variations may be apparent to those skilled in the art. For example, various components of the embodiments may be interchanged, added, or substituted in the other embodiments. Also, all of the elements of each figure are not necessary for operation of the disclosed embodiments. For example, one of ordinary skill in the art of the disclosed embodiments would be able to make and use the teachings of the present disclosure by simply employing the elements of the independent claims. Accordingly, embodiments of the present disclosure as set forth herein are intended to be illustrative, not limiting. Various changes may be made without departing from the spirit and scope of the present disclosure.

Even though numerous characteristics and advantages of the present disclosure have been set forth in the foregoing description, together with details of the structure and function of the invention, the disclosure is illustrative only. Changes may be made to details, especially in matters of shape, size, and arrangement of parts, within the principles of the invention to the full extent indicated by the broad general meaning of the terms in which the appended claims are expressed.

What is claimed is:

1. A coupler device, for use in a phased array system, the coupler device comprising:

a tunable amplifier, configured to convert an input signal to a first intermediate signal and a second intermediate signal; and a coupler, coupled to the tunable amplifier, wherein the coupler comprises a first input port receiving the first intermediate signal, a second input port receiving the second intermediate signal, a first output port outputting a first output signal, and a second output port outputting a second output signal;

wherein a phase difference between a first phase of the first output signal and a second phase of the second output signal is a fixed phase angle.

2. The coupler device of claim 1, wherein the tunable amplifier is further configured to adjust a first gain of the first intermediate signal and a second gain of the second intermediate signal so as to adjust the fixed phase angle.

3. The coupler device of claim 1, wherein a second difference between the first output signal and the input signal is $$\frac{\varphi}{2},$$

and a third difference between the second output signal and the input signal is $$-\frac{\varphi}{2},$$

and φ denotes the fixed phase angle.

4. The coupler device of claim 1, wherein the tunable amplifier comprises:
- a first bipolar junction transistor, having a base controlled by a first control voltage, a collector, connected to an input port of a first output matching network, and an emitter being grounded; and
- a second bipolar junction transistor, having a base controlled by a second control voltage, a collector, connected to an input port of a second output matching network, and an emitter being grounded;
- wherein the first bipolar junction transistor and the second bipolar junction transistor are shunted.

5. The coupler device of claim 4, wherein the tunable amplifier further comprises an input matching network configured to match an impedance of the first bipolar junction transistor and the second bipolar junction transistor to a system impedance.

6. The coupler device of claim 4, wherein the first output matching network and the second output matching network are substantially the same, and the first output matching network is configured to match a first output impedance of the first bipolar junction transistor to a system impedance, and the second output matching network is configured to match a second output impedance of the second bipolar junction transistor to the system impedance.

7. The coupler device of claim 1, wherein the tunable amplifier has functions of power conservation and signal amplification.

8. The coupler device of claim 1, wherein the coupler is a 90-degree hybrid coupler.

9. The coupler device of claim 8, wherein the coupler comprises:
- a first transmission line, coupled between the first input port and the first output port;
- a second transmission line, coupled between the first input port and the second output port;
- a third transmission line, coupled between the second input port and the first output port; and
- a fourth transmission line, coupled between the second input port and the second output port.

10. A coupler device, for use in a phased array system, the coupler device comprising:
- a power divider, configured to divide an input signal to generate a first signal and a second signal;
- a first balun (balance-to-unbalance), configured to convert the first signal to generate an inverted first signal;
- a second balun, configured to convert the second signal to generate an inverted second signal;
- a first variable gain amplifier, configured to amplify the inverted first signal to generate a third signal;
- a second variable gain amplifier, configured to amplify the inverted second signal to generate a fourth signal; and
- a coupler, coupled to the first variable gain amplifier and the second variable gain amplifier, wherein the coupler comprises a first input port receiving the third signal, a second input port receiving the fourth signal, a first output port outputting a fifth signal, and a second output port outputting a sixth signal.

11. The coupler device of claim 10, wherein a fixed phase angle exists between a first phase of the fifth signal and a second phase of the sixth signal.

12. The coupler device of claim 11, wherein the fixed phase angle is changed by adjusting a first gain of the inverted first signal and a second gain of the inverted second signal.

13. The coupler device of claim 10, further comprising:
- a first switch, coupled between the first balun and the first variable gain amplifier, and configured to select between the first signal and the inverted first signal output by the first balun; and
- a second switch, coupled between the second balun and the second variable gain amplifier, and configured to select between the second signal and the inverted second signal output by the second balun.

14. The coupler device of claim 10, wherein the first variable gain amplifier and the second variable gain amplifier are implemented by three-stage amplifiers which comprises an input stage, a gain stage, and an output stage connected in series.

15. The coupler device of claim 14, wherein the input stage comprises a common-gate amplifier, the gain stage comprises a common-source amplifier, and the output stage comprises a common-drain amplifier.

16. The coupler device of claim 15, wherein a variable resistor is disposed between the input stage and the gain stage to adjust a gain of the gain stage.

17. The coupler device of claim 10, wherein the coupler is a 90-degree hybrid coupler.

18. The coupler device of claim 10, wherein the first balun and the second balun are Marchand baluns.

19. The coupler device of claim 10, wherein the power divider is a Wilkinson power divider.

20. The coupler device of claim 19, wherein the Wilkinson power divider comprises two sets of coupled lines, and each set of coupled lines has a length of λ/4, wherein λ denotes a wavelength of a radio frequency signal used by the phased array system.

* * * * *